(12) United States Patent
Gonzalez

(10) Patent No.: US 6,271,071 B1
(45) Date of Patent: *Aug. 7, 2001

(54) FABRICATION PROCESS FOR REDUCED AREA STORAGE NODE JUNCTION

(75) Inventor: Fernando Gonzalez, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/056,419

(22) Filed: Apr. 6, 1998

Related U.S. Application Data

(62) Division of application No. 08/633,875, filed on Apr. 11, 1996, now abandoned, which is a division of application No. 08/558,442, filed on Nov. 16, 1995, now Pat. No. 5,608,249.

(51) Int. Cl.$^7$ ................................................ H01L 21/8242
(52) U.S. Cl. .......................................... 438/238; 438/653
(58) Field of Search ................................. 438/253–256, 438/390–398, 238, 286, 653, 649, 682

(56) References Cited

U.S. PATENT DOCUMENTS

| | | | |
|---|---|---|---|
| 4,794,563 | * 12/1988 | Maeda . | |
| 4,951,175 | * 8/1990 | Kurosawa et al. . | |
| 4,990,463 | * 2/1991 | Mori . | |
| 5,156,993 | 10/1992 | Su | 437/52 |
| 5,234,856 | 8/1993 | Gonzalez | 437/47 |
| 5,320,970 | 6/1994 | Hori et al. | 437/44 |
| 5,395,784 | 3/1995 | Lu et al. | 437/52 |
| 5,406,512 | 4/1995 | Kagenishi | 257/296 |
| 5,422,315 | 6/1995 | Kobayashi | 257/296 |
| 5,492,853 | 2/1996 | Jeng et al. | 437/60 |
| 5,508,215 | 4/1996 | Jeng et al. | 437/60 |
| 5,747,844 | * 5/1998 | Aoki et al. . | |
| 5,777,358 | 7/1998 | Yajima | 257/306 |
| 5,817,572 | 10/1998 | Chiang | 438/624 |

FOREIGN PATENT DOCUMENTS

| 4179265 | 6/1992 | (JP) | 257/306 |
|---|---|---|---|

* cited by examiner

*Primary Examiner*—Jey Tsai
(74) *Attorney, Agent, or Firm*—Ormiston & McKinney, PLLC

(57) ABSTRACT

An improved storage node junction between a doped active area in a semiconductor substrate and an overlying layer of polysilicon, such as the storage node junction in a DRAM memory cell. The area and perimeter of the storage node junction is significantly reduced and the junction is moved away from the adjacent isolation structure. An exemplary semiconductor device incorporating the new junction includes a storage node junction between a conductive polysilicon layer and an active area on a semiconductor substrate, the substrate having been subjected to LOCOS steps to create active areas bounded by a region of field oxide. An insulated gate electrode is formed over an active area on the substrate, which has been doped to a first conductivity type. A contact region comprising a portion of the active area extends laterally between one side of the gate electrode and the field oxide region. The contact region has a first segment adjacent to the gate electrode and a second segment interposed between the first segment and the field oxide region. The first segment is thereby isolated from the field oxide region by the second segment. The first segment is doped to a second conductivity type. A layer of storage polysilicon is formed in electrical contact with the first segment of the contact region but not the second segment of the contact region. The storage polysilicon is isolated from the field oxide through an insulating layer interposed between the storage polysilicon and the second segment of the contact region.

10 Claims, 4 Drawing Sheets

FABRICATION PROCESS FOR REDUCED AREA STORAGE NODE JUNCTION

CROSS REFERENCE TO RELATED APPLICATIONS

This is a divisional of U.S. application and Ser. No. 08/633,875 filed Apr. 11, 1996, abandoned which is a divisional of Ser. No. 08/558,442 filed Nov. 16, 1995, U.S. Pat. No. 5,608,249.

FIELD OF THE INVENTION

The invention relates generally to the formation of semiconductor devices and, more particularly, to reduced area storage node junction process for fabrication such a junction.

BACKGROUND OF THE INVENTION

Generally, integrated circuits are mass produced by forming many identical circuit patterns on a single silicon wafer, which is thereafter cut into many identical dies or "chips." Integrated circuits, also commonly referred to as semiconductor devices, are made of various materials that may be electrically conductive, electrically nonconductive or electrically semiconductive. Silicon, in single crystal or polycrystalline form, is the most commonly used semiconductor material. Both forms of silicon can be made electrically conductive by adding impurities. The introduction of impurities into silicon is commonly referred to as doping. Silicon is typically doped with boron or phosphorus. Boron atoms have one less valence electron than silicon atoms. Therefore, if the silicon is doped with boron, then electron "holes" become the dominant charge carrier and the doped silicon is referred to as p-type silicon. By contrast, phosphorous atoms have one more valence electron than silicon atoms. If the silicon is doped with phosphorous, then electrons become the dominant charge carriers and the doped silicon is referred to as n-type silicon.

Dynamic Random Access Memory devices (DRAMs) comprise arrays of memory cells which contain two basic components—a field effect access transistor and a capacitor. Typically, one side of the transistor is connected to one side of the capacitor. This connection is made between a capacitor bottom electrode or "storage node" and an active area. The substrate areas in a DRAM in which electrical connections are made are generally referred to as active areas. Active areas consist of discrete specially doped regions in the surface of the silicon substrate which serve as electrical contact points (or "buried contacts") as well as source/drain regions for the access transistor. The other side of the transistor and the transistor gate electrode are connected to external contacts—a bit line and a word line, respectively. The other side of the capacitor, the capacitor top electrode or "cell plate," is connected to a reference voltage. Therefore, the formation of the DRAM memory cell comprises the formation of a transistor, a capacitor, a connection between the capacitor and the transistor, and contacts to external circuits.

The many advantages of the formation of smaller circuit components, so that more and more memory cells may be packed onto each chip, are well known. One such advantage of miniaturization of cell components, and the corresponding reduction in memory cell spacing, is that the operating voltages for the DRAM may be decreased. Thus, the cost to operate the device is reduced and its reliability and longevity is enhanced. Lower operating voltages, however, reduce the time within which each memory cell must be recharged or "refreshed" because less charge is stored on the cell. In DRAMs, the charge on each memory cell must be refreshed periodically because the cell loses or "leaks" charge through the junctions between areas within the silicon substrate having different doping/conductivity characteristics. If the cell is not refreshed before losing a threshold level of charge, then the cell will fail, i.e., lose the bit of information stored therein. And, if a cell fails, then the chip itself is defective and cannot be used. The rate at which charge is leaked through these junctions is an important factor in determining refresh time—the time within which each cell must be recharged. Consequently, it is advantageous to minimize junction leakage to increase refresh time and help compensate for the reductions in refresh time caused by lower operating voltages.

Improvements in refresh are also needed to compensate for increased packing densities. As more and more cells are packed onto each chip, more time is required to refresh all of the cells on the chip. Further, as cell size is reduced, the junction perimeter becomes a more dominant source of leakage and refresh loss mechanism. Since refresh time is controlled by the weakest cell, the average refresh for all cells must be increased to keep the weakest cell above the minimum threshold. There is, thus, a need to lessen or eliminate the effects of perimeter junction leakage and other loss mechanisms to enhance refresh.

SUMMARY OF THE INVENTION

The present invention is directed to an improved storage node junction between a doped active area in a semiconductor substrate and an overlying layer of polysilicon, such as the storage node junction, sometimes also referred to as the capacitor buried contact, in a DRAM memory cell. The area and perimeter of the storage node junction is significantly reduced and the junction is moved away from the adjacent isolation structure. These factors will reduce junction leakage and enhance refresh.

Accordingly, these and other objects and advantages are achieved by a semiconductor device having a storage node junction between a conductive polysilicon layer and an active area on a semiconductor substrate, the substrate having been subjected to field isolation steps to create active areas bounded by a region of field oxide. The device includes an insulated gate electrode over an active area on the substrate, which has been doped to a first conductivity type. A contact region comprising a portion of the active area extends laterally between one side of the gate electrode and the field oxide region. The contact region has a first segment adjacent to the gate electrode and a second segment interposed between the first segment and the field oxide region. The first segment is thereby isolated from the field oxide region by the second segment. The first segment is doped to a second conductivity type. A layer of storage polysilicon is formed in electrical contact with the first segment of the contact region but not the second segment of the contact region. In one preferred embodiment of the invented semiconductor device, the storage polysilicon is isolated from the field oxide through an insulating layer interposed between the storage polysilicon and the second segment of the contact region.

In another aspect of the invention, this structure is incorporated into a dynamic random access memory cell, which comprises:

a. an electrically insulated transistor gate electrode over a first conductivity type semiconductor substrate;

b. a first contact region for electrical connection to a bit line, the first contact region being defined in the substrate laterally adjacent to one side of the gate electrode;

c. a second contact region for electrical connection to a memory cell capacitor, the second contact region being defined in the substrate laterally adjacent to another side of the gate electrode and extending between the gate electrode and a region of field oxide, the second contact region having a first segment adjacent to the gate electrode and a second segment interposed between the first segment and the field oxide region, the first segment being thereby isolated from the field oxide region by the second segment, and the first segment being doped to a second conductivity type;

d. a capacitor storage node formed over the substrate in electrical contact with the first segment of the second contact region and in electrical isolation from the second segment of the second contact region;

e. a dielectric layer over the capacitor storage node; and f. a capacitor cell plate over the dielectric layer.

The storage node is preferably isolated from the field oxide by means of an insulating layer interposed between the storage node and the second segment of the second contact region.

The invention also includes a process for fabricating a dynamic random access memory cell having an access transistor and a capacitor, both of which are formed on an active area of a semiconductor substrate. The active area is bounded by a region of field oxide and the capacitor is electrically connected to the access transistor through a buried contact formed in the active area. The basic process includes the single step of physically isolating the capacitor buried contact from the field oxide. In one version of the invented process, this isolation is incorporated into the fabrication of a DRAM memory cell according to the following steps:

a. providing an electrically insulated transistor gate electrode over a first conductivity type semiconductor substrate;

b. defining a first contact region for electrical connection to a bit line, the first contact region being defined in the substrate laterally adjacent to one side of the gate electrode;

c. defining a second contact region for electrical connection to a memory cell capacitor, the second contact region being defined in the substrate laterally adjacent to another side of the gate electrode and extending between the gate electrode and a region of field oxide, the second contact region having a first segment adjacent to the gate electrode and a second segment adjacent to the field oxide region, the first segment being electrically isolated from the field oxide region by the second segment;

d. implanting a second conductivity type dopant into the first contact region and into only the first segment of the second contact region;

e. depositing a layer of storage polysilicon over the substrate in contact with the first segment of the second contact region;

f. patterning and etching the layer of storage polysilicon to define a capacitor storage node;

g. depositing a dielectric layer over the capacitor storage node;

h. depositing a second layer polysilicon over the dielectric layer; and i. patterning and etching the second layer of polysilicon to define a capacitor cell plate.

In one preferred embodiment of the fabrication process, the first and second segments are defined prior to depositing the storage polysilicon by forming a layer of insulating material over the entire contact region and then patterning and etching the insulating layer to expose only that portion of the contact region adjacent to the gate electrode, i.e, the first segment of the contact region. In this way, the area of the storage node junction is reduced to only a portion of the contact region and the junction is moved away and electrically isolated from the field oxide.

BRIEF DESCRIPTION OF THE DRAWINGS

FIG. 1 shows the cell at the stage where the field oxide, gate insulating layer, gate electrodes and the first insulating layer have been formed.

FIG. 2 shows the cell following the n-type LDD implant.

FIG. 3 shows the cell after the second insulating layer has been formed.

FIG. 4 shows the cell after formation of the thin conductive layer that will serve as a diffusion barrier to the subsequently formed storage node polysilicon.

FIG. 5 shows the cell after deposition of the storage node polysilicon.

FIG. 6 shows the cell after the storage poly has been patterned and etched to form the capacitor storage node.

FIG. 7 shows the cell after the formation of the capacitor dielectric and cell polysilicon.

FIG. 8 shows the completed memory cell.

The figures are not meant to be actual views of a DRAM memory cell, but merely idealized representations used to depict the structure and process of the invention.

DETAILED DESCRIPTION OF THE INVENTION

FIGS. 1–8 depict the improved storage node junction in a stacked capacitor DRAM memory cell. Each of these cross section views may represent a number of different individual process steps carried out to arrive at the particular structure shown. Since the individual process steps are conventional and well known to those skilled in the art of semiconductor device manufacturing, several of these steps have been combined in the various figures for the sake of simplicity and to better illustrate the preferred embodiment of the invented structure. Also, the fabrication of semiconductor devices includes etching predetermined patterns into layers of various material stacked over the semiconductor substrate. This process is sometimes referred to herein for convenience as "patterning and etching." Photolithography and reactive ion etching, for example, are commonly used pattern and etch processes. These or other pattern and etch processes, well known to those skilled in the art, may be used to implement the present invention.

Figure 1:
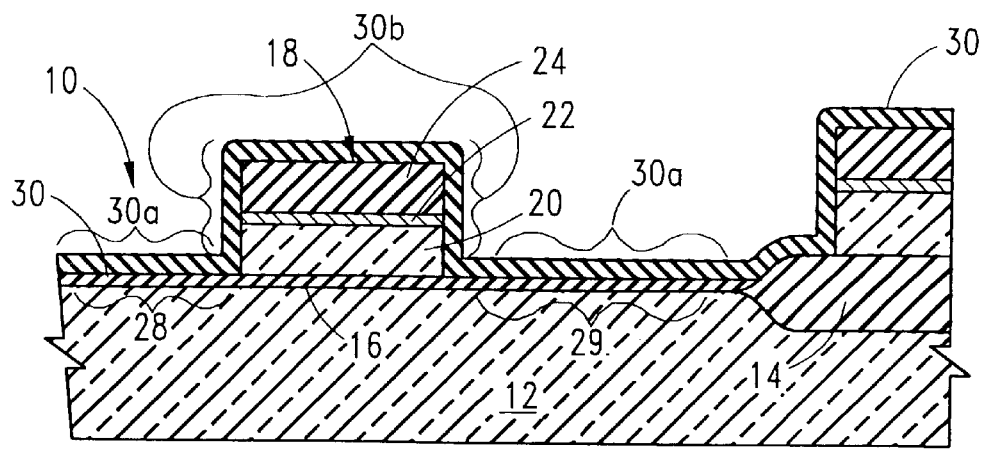
FIGS. 1–8 are cross section views illustrating a DRAM memory cell fabricated according to the preferred embodiment of the invention. More particularly.

Referring first to FIG. 1, wafer 10 comprises a lightly doped p-type single crystal silicon substrate 12 on which field oxide region 14, gate insulating layer 16, and gate electrode 18 have been formed. The field oxide regions provide electrical isolation between the memory cell array and the periphery as well as between individual memory cells within the array. Field oxide region 14 is typically formed using Local Oxidation Of Silicon ("LOCOS") wherein an apertured layer of silicon nitride (not shown) or other non-oxidizable material is formed on the surface of substrate 12 and thereafter the exposed portions of the substrate are oxidized. The nitride layer is then removed. An oxide projection, commonly referred to as a "bird's beak", forms at the periphery of field oxide region 14. Transistor gate electrode 18 is formed by successively depositing or "stacking" layers of polysilicon 20, tungsten suicide 22 and silicon dioxide 24 over thin gate insulating layer 14, and then patterning and etching those layers to expose substrate 12 at the desired locations of the source and drain for the access transistors. These layers are deposited, patterned and etched using conventional methods well known in the art. Alternatively, transistor gate electrode 18 may be formed of a single layer of polysilicon deposited and etched as describe above. The tungsten silicide and silicon dioxide layers are included herein simply to better illustrate the details of one of the preferred embodiments of the invention. A first insulating layer 30 is then formed over the in process structure. First insulating layer 30 is preferably made of silicon nitride or other suitable insulating material that is selectively etchable with respect to silicon dioxide. Optionally, a thin layer of silicon dioxide (not shown) may be deposited before formation of nitride layer 30. Nitride layer 30 is about 200 angstroms thick and the optional oxide layer, if used, is about 100 angstroms thick.

Figure 2:
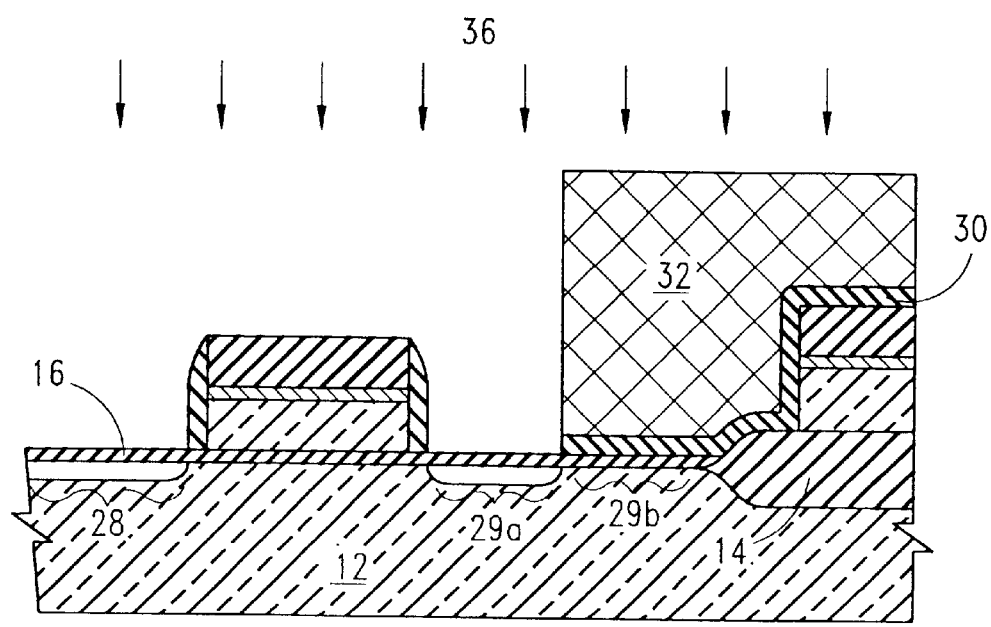

In conventional DRAM fabrication, the lightly doped drain implants (LDDs) would now be formed by vertically implanting n-type impurities into bit line contact region 28 and capacitor buried contact region 29 beneath the horizontal regions 30a of first insulating layer 30. This implant is usually self aligned to and masked by the vertical regions 30b of first insulating layer 30. By contrast, according to the present invention and as described below, the n-type LDD implant for the capacitor buried contact is made only into that portion of contact region 29 immediately adjacent to the access transistor gate. Referring now to FIG. 2, implant mask 32 is formed over the in process structure and patterned to expose (through first insulating layer 30) that portion of capacitor buried contact region 29 immediately adjacent to gate electrode 18. N-type impurities are vertically implanted into the unmasked substrate through the horizontal regions 30a of first insulating layer 30 as indicated symbolically by arrows 36. This LDD implant will be self aligned to the vertical regions 30b of first insulating layer 30. The preferred LDD n-type dopants are phosphorus, arsenic, antimony or a combination of these dopants. As is known to those skilled in the art, the type of dopant and the doping parameters for the LDD implant may be varied to obtain the desired storage node junction characteristics. For example, if phosphorus is used, the phosphorus is implanted at doses of approximately $1-5\times10^{13}$ ions per square centimeter and an implantation energy in the range of 20 to 100 KeV. Implantation at these energy levels results in ion distribution depths of approximately 500–1000 angstroms. Optionally, p-type impurities, typically boron atoms, may be implanted into contact regions 28 and 29 prior to the n-type LDD implant. Boron ions are typically implanted at an energy level of approximately 25–50 KeV, to a depth of approximately 1000 angstroms. The resulting doped p-type regions extend into the channel area between the source and drain for each access transistor. Although this boron halo implant may improve the transistor characteristic by reducing short channel effects such as $V_t$ rollover, sub $V_t$ slope, punch-through and the like, it is not preferred because it tends to increase storage node junction leakage.

Following the LDD implant, and using the implant mask 32 as an etch mask, first insulating layer is etched to expose substrate 12 at bit line contact region 28 and capacitor buried contact region 29. Alternatively, if the optional silicon dioxide layer is formed under first insulating layer 30, first insulating layer 30 may be etched before the n-type LDD implant. The LDD implant described above (and the halo boron implant, if performed) typically will by annealed by heating the structure to about 900° C. for approximately 30 minutes to drive the impurities laterally into the channel region under the edge of gate electrode 18 and under the edge of first insulating layer 30, as best seen by comparing FIGS. 2 and 3.

Figure 3:
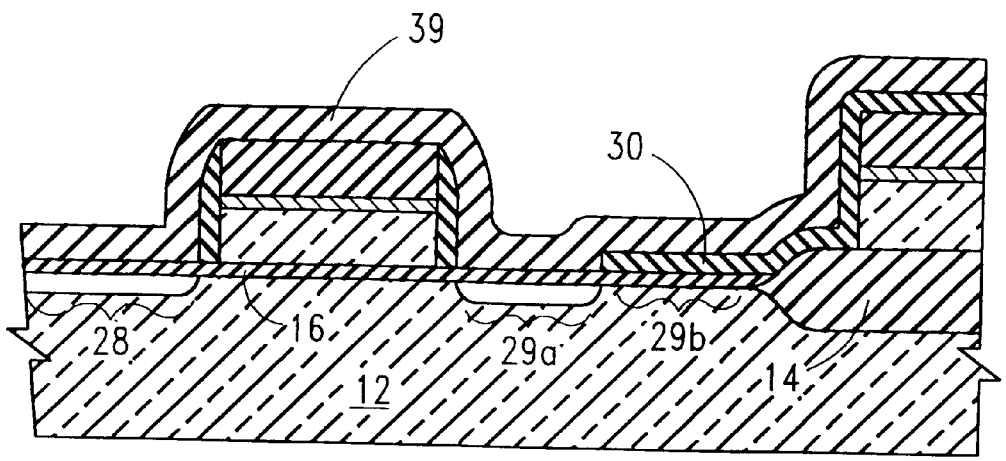
Figure 4:
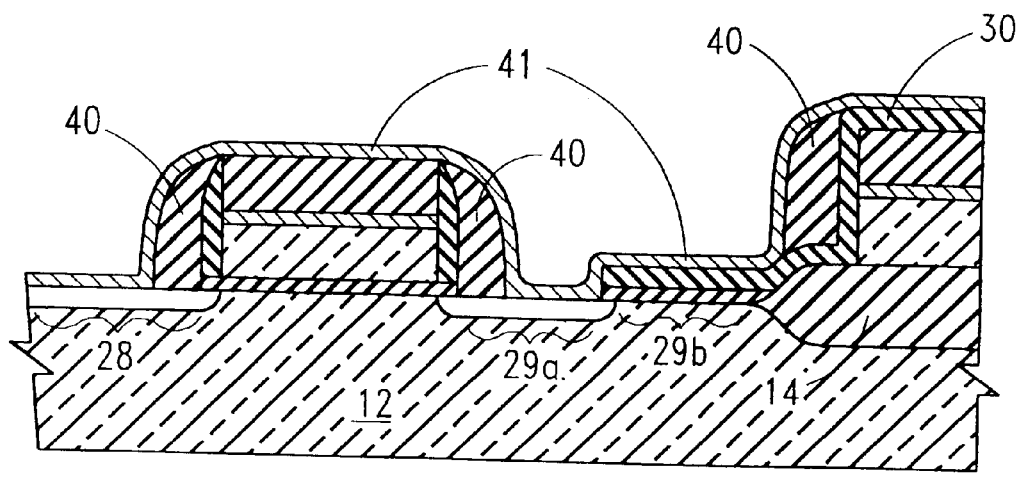
Figure 5:
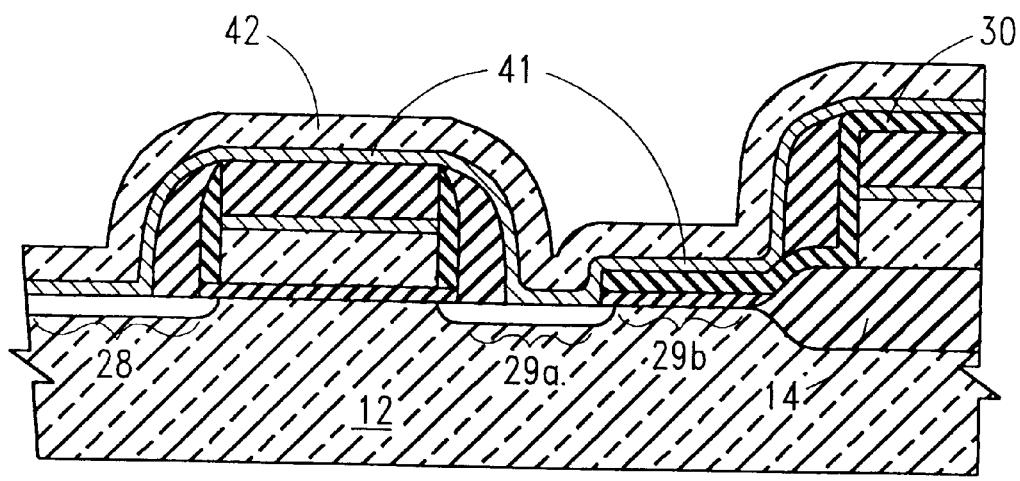
Figure 6:
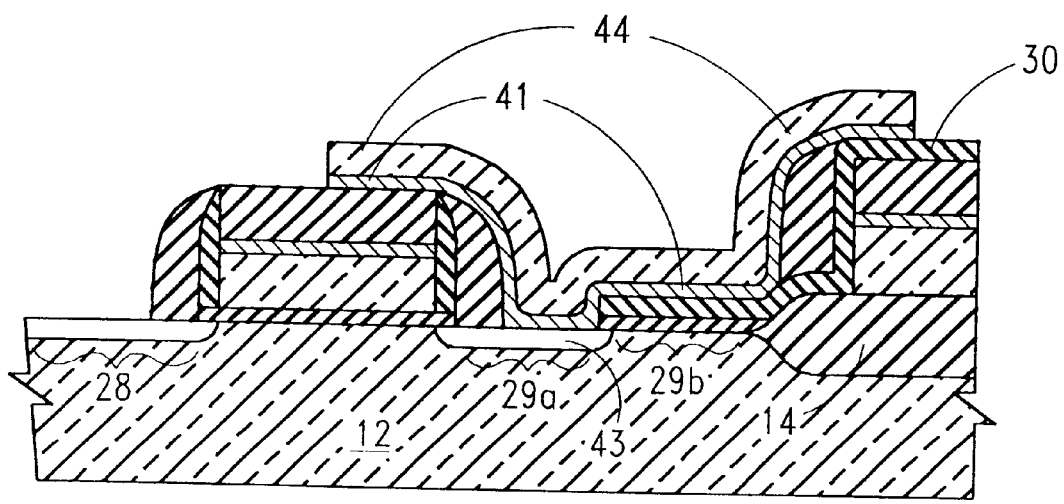

Referring to FIG. 3, implant mask 32 has been removed and a second insulating layer 39 has been deposited over the in process structure. Second insulating layer is made of silicon dioxide or other suitable insulating material that is selectively etchable with respect to first insulating layer 30. Second insulating layer 39 is patterned and etched to form spacers 40 on the sidewalls of gate electrode 18, as shown in FIG. 4. Preferably, a thin layer of conductive material 41 is then be formed over the upper surface of the in process structure. Conductive layer 41 preferably consists of a transition metal silicide or transition metal nitride. Example transition metals include tungsten (W), molybdenum (Mo), tantalum (Ta), titanium (Ti), protactinium (Pa), nickel (Ni) and cobalt (Co). The most preferred transition conductive material is titanium nitride (TiN). The preferred thickness for conductive layer 41 is from about 200 angstroms to about 1000 angstroms. Thereafter, a first layer of polysilicon 42, also commonly referred to as storage poly, is then deposited over the in process structure as shown in FIG. 5. Storage poly 42 is doped, preferably rough textured, polysilicon. The storage poly may be doped insitu, by implantation or by diffusion. Storage poly 42 is typically doped insitu with an n-type dopant such as phosphorous to a level within the range of $1\times10^{19}$ to $1\times10^{21}$ atoms per cubic centimeter. Conductive layer 41 serves as a diffusion barrier for restricting the conductivity enhancing impurity from migrating downwardly into contact regions 28 and 29. Such migration is undesirable if it reaches under gate electrode 18 and thereby degrades the sub-threshold voltage characteristics and lowers the threshold voltage of the access transistor. Thin conductive layer 41 also serves as an etch stop for the storage poly etch described below.

Storage poly 42 is patterned and etched to form capacitor storage node 44. Storage node 44 is the capacitor bottom electrode. Thin conductive layer 41 is thereafter etched in the same pattern to form the structure shown in FIG. 6. Contact region 29 can now be seen to consist of two segments. The first segment 29a is that portion of contact region 29 adjacent to gate electrode 18 that has received the n-type implant. The second segment 29b is that portion of contact region 29 adjacent to the edge of field oxide 14—second segment 29b was masked during the n-type implant. Storage node junction 43 is, therefore, electrically and physically isolated from field oxide 14. It should be noted here that diffusion barrier/conductive layer 41 is optional and, for some structural configurations and process flows, may not be necessary or desirable. For example, spacers 40 may be made sufficiently thick to protect against out-diffusion of the storage poly dopants into the transistor channel region and, thus, a diffusion barrier may not be necessary. Also, out-diffusing the storage poly dopants into the contact region may be desirable to ensure that the storage node junction will form along the full length of the storage poly/substrate interface. It is to be understood that, if a thin conductive layer 41 or similar such discrete etch stop is not used, then the oxide spacer etch should not remove second insulating layer 39 from bit line contact region 28. In that case, second insulating layer 39 will serve as an etch stop in the bit line contact region 28 during the storage poly etch.

Figure 7:
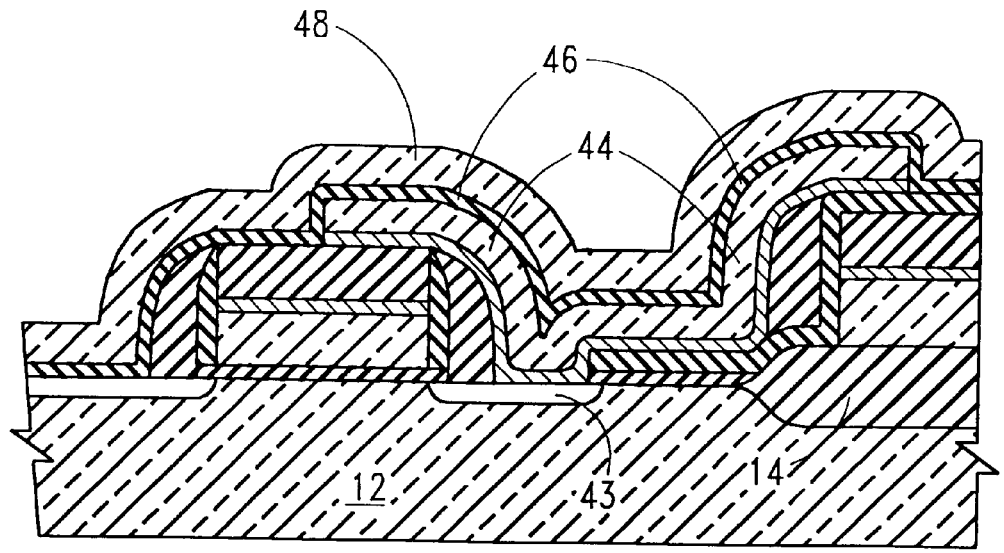
Figure 8:
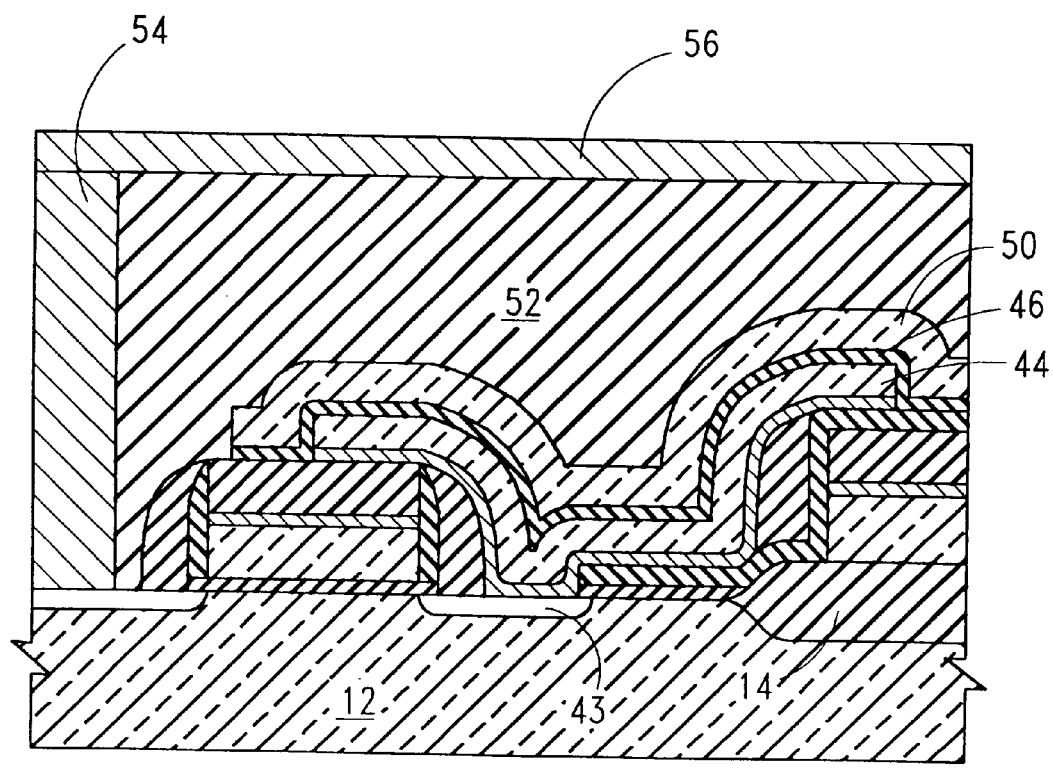

Referring to FIGS. 7 and 8, capacitor dielectric 46 is formed over the in process structure. Capacitor dielectric 46 is preferably made of silicon nitride or other materials with high dielectric constants. A second layer of polysilicon 48, also commonly referred to as the cell poly, is deposited over dielectric layer 46. Cell poly 48 is patterned and etched to form capacitor cell plate 50 and the etch may continue down through capacitor dielectric 46. Cell plate 50 is the capacitor top electrode. A thick upper insulating layer 52 of BPSG or other suitable insulating material is formed over the exposed upper surfaces of the structure previously formed. Upper insulating layer 52 is patterned and etched to form an opening for bit line contact 54. Upper insulating layer 52 may be planarized using chemical mechanical polish (CMP) or other suitable processes prior to etching. Bit line contact 54 and bit line 56 are formed using metal deposition techniques well known in the art.

There has been shown and described a new semiconductor device and fabrication process wherein the area of the storage node junction is significantly reduced and the junction is moved away from the edge of the isolation structure. The particular embodiments shown in the drawings and described herein are for purposes of example and should not be construed to limit the invention as set forth in the appended claims. Those skilled in the art may now make numerous uses and modifications of the specific embodiments described without departing from the scope of the invention. For instance, the invention could be readily incorporated into container cell DRAMs, Static Random Access Memories (SRAMs), logic circuit semiconductor devices and other such devices where a storage node junction is made in the substrate adjacent to field oxide or similar isolation structures.

What is claimed is:

1. A process for making a semiconductor device, comprising:
   a. forming on a substrate an active area at least partially bounded by an isolation structure;
   b. defining a contact region in the active area;
   c. defining a first segment of the contact region and forming diffusion barrier over the first segment of the contact region;
   d. defining a second segment of the contact region between the first segment and the isolation structure to electrically isolate the first segment from the isolation structure; and
   e. forming a conductive element having a generally horizontal portion over both segments of the contact region, the generally horizontal portion of the conductive element in electrical contact with the first segment of the contact region and electrically isolated from the second segment.

2. A process according to claim 1, further comprising the steps of:
   a. providing a first conductivity type substrate; and
   b. doping the first segment to a second conductivity type opposite the first conductivity type.

3. A process for making a semiconductor device having a junction between a polysilicon conductor and a substrate, the process comprising the steps of:
   a. forming on the substrate an active area at least partially bounded by an isolation structure;
   b. defining a contact region in the active area;
   c. defining a first segment of the contact region and forming diffusion barrier over the first segment of the contact region;
   d. defining a second segment of the contact region between the first segment and the isolation structure to electrically isolate the first segment from the isolation structure; and
   e. forming a polysilicon conductor having a generally horizontal portion over both segments of the contact region, the generally horizontal portion of the polysilicon conductor in electrical contact with the first segment of the contact region and electrically isolated from the second segment.

4. A process according to claim 3, further comprising forming a diffusion barrier between the polysilicon conductor and the first segment of the contact region.

5. A process according to claim 3, further comprising forming insulating material between the polysilicon conductor and the second segment of the contact region.

6. A process for making a semiconductor device, comprising:
   a. forming on a substrate an active area at least partially bounded by an isolation structure;
   b. defining a contact region in the active area along a surface of the substrate adjacent to the isolation structure;
   c. defining a first segment of the contact region and forming diffusion barrier over the first segment of the contact region;
   d. defining a second segment of the contact region between the first segment and the isolation structure to electrically isolate the first segment from the isolation structure; and
   e. forming a conductive element having a generally horizontal portion over both segments of the contact region, the generally horizontal portion of the conductive element in electrical contact with the first segment of the contact region and electrically isolated from the second segment.

7. A process according to claim 6, further comprising the steps of:
   a. providing a first conductivity type substrate; and
   b. doping the first segment to a second conductivity type opposite the first conductivity type.

8. A process for making a semiconductor device having a junction between a polysilicon conductor and a substrate, the process comprising the steps of:
   a. forming on the substrate an active area at least partially bounded by an isolation structure;
   b. defining a contact region in the active area along a surface of the substrate adjacent to the isolation structure;
   c. defining a first segment of the contact region and forming diffusion barrier over the first segment of the contact region;
   d. defining a second segment of the contact region between the first segment and the isolation structure to electrically isolate the first segment from the isolation structure; and
   e. forming a polysilicon conductor having a generally horizontal portion over both segments of the contact region, the generally horizontal portion of the polysilicon conductor in electrical contact with the first segment of the contact region and electrically isolated from the second segment.

9. A process according to claim 8, further comprising forming a diffusion barrier between the polysilicon conductor and the first segment of the contact region.

10. A process according to claim 8, further comprising forming insulating material between the polysilicon conductor and the second segment of the contact region.

* * * * *